US012689372B2

(12) United States Patent
Ariturk et al.

(10) Patent No.: US 12,689,372 B2
(45) Date of Patent: Jul. 21, 2026

(54) SWITCH OFF STATE ISOLATION

(71) Applicant: TEXAS INSTRUMENTS INCORPORATED, Dallas, TX (US)

(72) Inventors: Gokhan Ariturk, Norman, OK (US); Adam Fruehling, Garland, TX (US); Ting-Ta Yen, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/308,491

(22) Filed: Apr. 27, 2023

(65) Prior Publication Data

US 2024/0364335 A1 Oct. 31, 2024

(51) Int. Cl.
H03K 17/693 (2006.01)
H03K 17/10 (2006.01)
H03K 17/687 (2006.01)

(52) U.S. Cl.
CPC ......... H03K 17/693 (2013.01); H03K 17/102 (2013.01); H03K 17/6871 (2013.01)

(58) Field of Classification Search
None
See application file for complete search history.

(56) References Cited

U.S. PATENT DOCUMENTS 6,091,247 A * 7/2000 Liu ...................... G01R 35/005
324/638
7,457,593 B2 * 11/2008 Noest ...................... H03H 7/24
455/226.1

OTHER PUBLICATIONS

High-isolation Stacked RF Switch using dc-lift and Feedforward Cancellation Techniques in Standard 65 nm CMOS, Muh-Dey Wei et al., IEEE, 2018.

* cited by examiner

*Primary Examiner* — Cassandra F Cox
(74) *Attorney, Agent, or Firm* — Zhenhai Fu; Frank D. Cimino

(57) ABSTRACT

An apparatus includes a switch assembly having first and second switch terminals and a control terminal. The switch assembly includes a leakage attenuation circuit. The switch assembly is configured to, responsive to the control terminal having a first state, connect the first switch terminal to the second switch terminal and disconnect a circuit terminal of the leakage attenuation circuit from the first switch terminal. The switch assembly is configured to, responsive to the control terminal having a second state, connect the terminal of the leakage attenuation circuit to the first switch terminal and disconnect the first switch terminal from the second switch terminal.

27 Claims, 12 Drawing Sheets

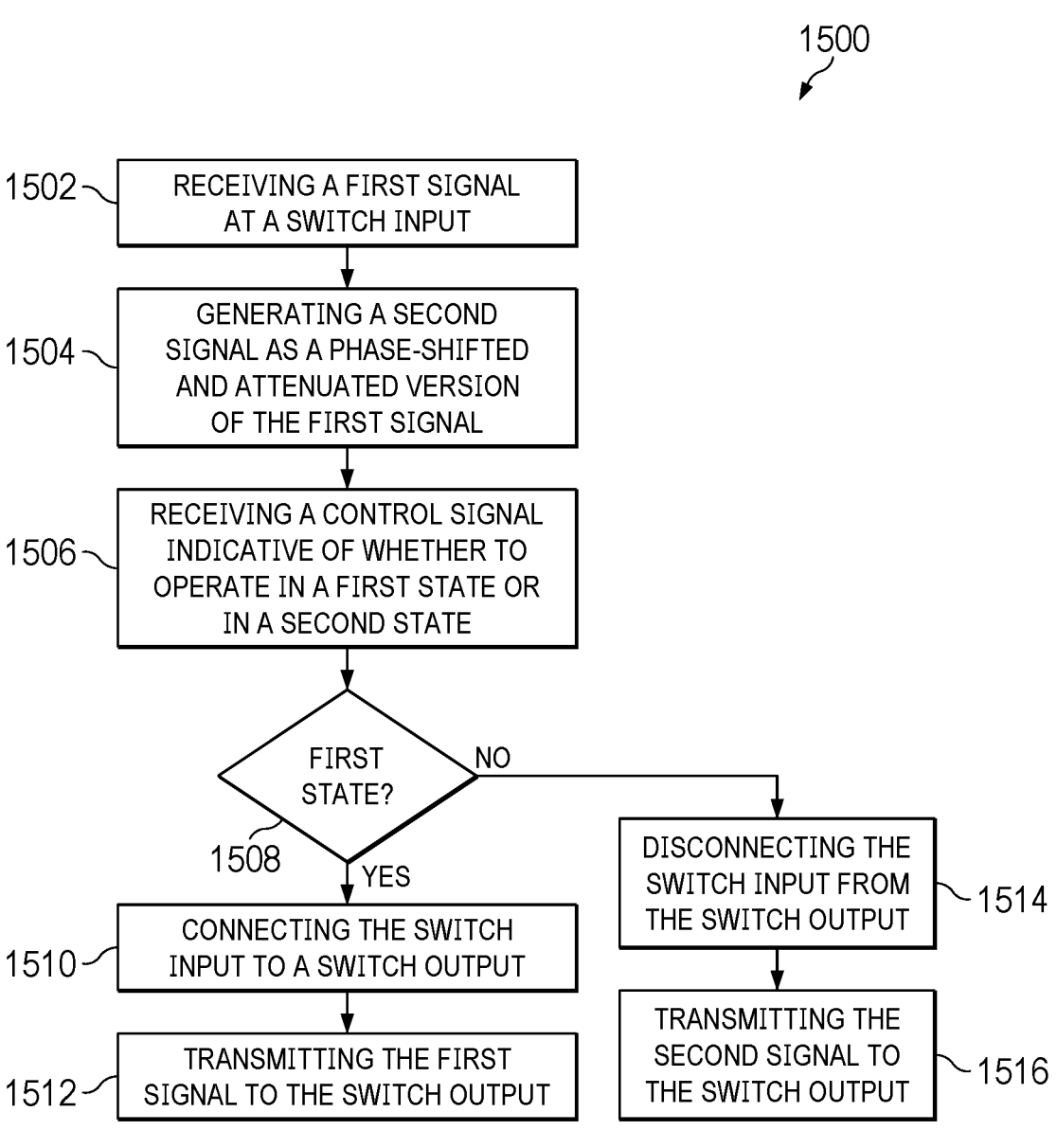

1500

1502 — RECEIVING A FIRST SIGNAL AT A SWITCH INPUT

1504 — GENERATING A SECOND SIGNAL AS A PHASE-SHIFTED AND ATTENUATED VERSION OF THE FIRST SIGNAL

1506 — RECEIVING A CONTROL SIGNAL INDICATIVE OF WHETHER TO OPERATE IN A FIRST STATE OR IN A SECOND STATE

FIRST STATE?

1508

NO

YES

1510 — CONNECTING THE SWITCH INPUT TO A SWITCH OUTPUT

1512 — TRANSMITTING THE FIRST SIGNAL TO THE SWITCH OUTPUT

DISCONNECTING THE SWITCH INPUT FROM THE SWITCH OUTPUT — 1514

TRANSMITTING THE SECOND SIGNAL TO THE SWITCH OUTPUT — 1516

FIG. 15

SWITCH OFF STATE ISOLATION

BACKGROUND

A switch can be closed or opened to, respectively, electrically connect or disconnect between two terminals. When the switch is closed, the switch can be in on state and allow a signal to flow between the two terminals. When the switch is opened, the switch can be in an off state. When the switch is in an off state, the switch can provide isolation between the two terminals to prevent signals from flowing between the two terminals.

SUMMARY

In one example, an apparatus includes a switch assembly having first and second switch terminals and a control terminal. The switch assembly includes a leakage attenuation circuit. The switch assembly is configured to, responsive to the control terminal having a first state, connect the first switch terminal to the second switch terminal and disconnect a circuit terminal of the leakage attenuation circuit from the first switch terminal. The switch assembly is configured to, responsive to the control terminal having a second state, connect the terminal of the leakage attenuation circuit to the first switch terminal and disconnect the first switch terminal from the second switch terminal.

In another example, a method includes receiving a first signal at a first switch terminal and generating a second signal as a phase-shifted and attenuated version of the first signal. The method further includes determining whether operation of a switch assembly is in a first state or in a second state. Responsive to operation in the first state, the method includes connecting the first switch terminal to the second switch terminal and transmitting the first signal to the second switch terminal. Responsive to operation in the second state, the method includes disconnecting the first switch terminal from the second switch terminal and transmitting the second signal to the second switch terminal.

BRIEF DESCRIPTION OF THE DRAWINGS

FIG. 15 is a flow chart of a method of controlling a flow of signal by a switch assembly in accordance with various examples.

DETAILED DESCRIPTION

Figure 1:
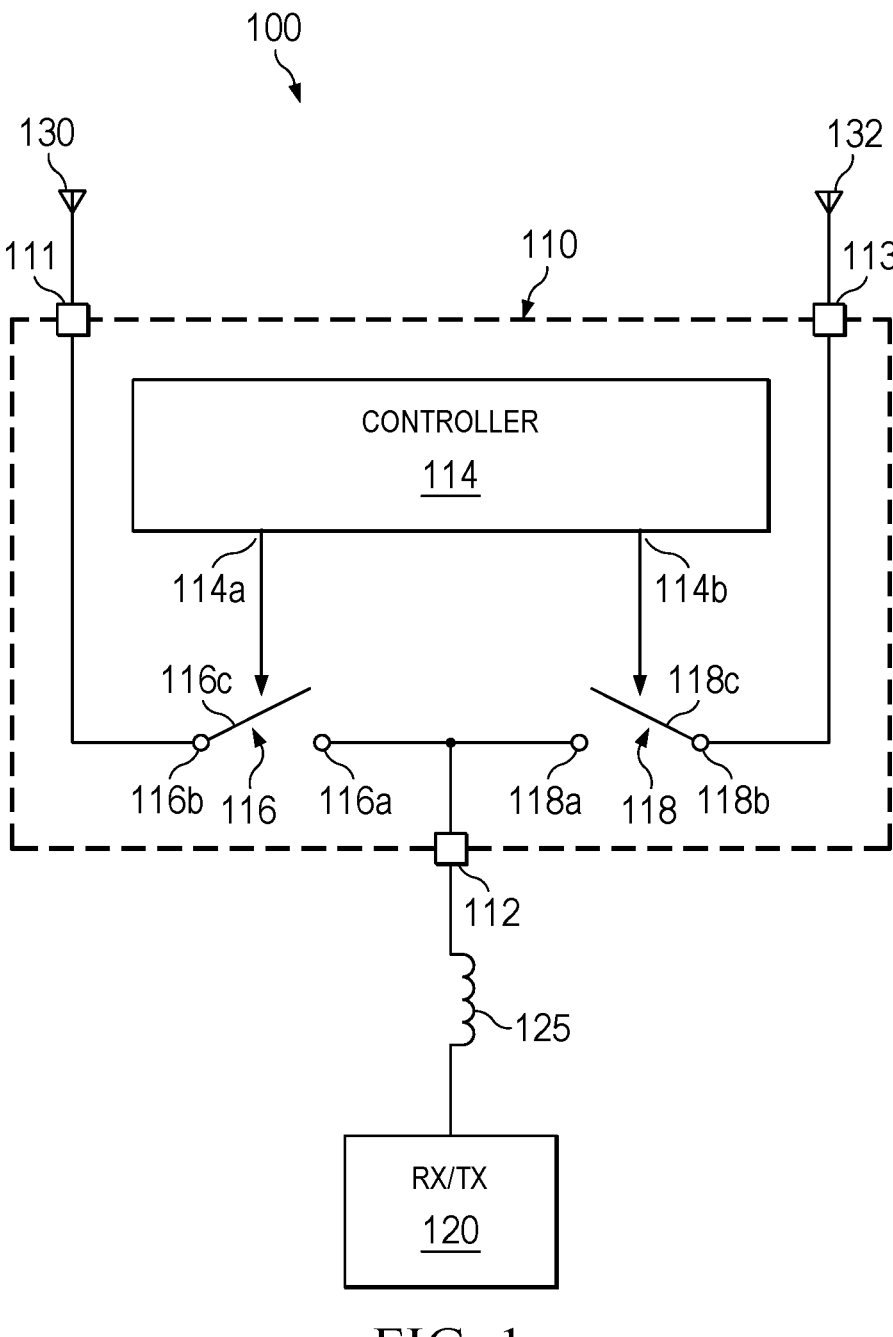
FIG. 1 is a schematic diagram of a system including a switch assembly in accordance with various examples.

The same reference numbers or other reference designators are used in the drawings to designate the same or similar (either by function and/or structure) features.

FIG. 1 is a schematic diagram of a bidirectional communication system 100. Communication system 100 includes a switch system 110, antennas 130 and 132, and a transceiver (RX/TX) 120. The switch system 110 includes radio frequency (RF) terminals 111, 112, and 113. Antenna 130 can be coupled to RF terminal 111. Antenna 132 can be coupled to RF terminal 113. Transceiver 120 can be coupled to RF terminal 112. Transceiver 120 can transmit electrical signals (e.g., data) through the switch system 110 to one of antenna 130 or antenna 132, and one of the antennas 130 or 132 can convert the electrical signals to wireless signals, and transmit the wireless signals. Further, antennas 130 and 132 can receive wireless signals and convert the wireless signals to electrical signals. Through switch system 110, transceiver 120 can receive and process the electrical signals from one of antennas 130 or 132. In some examples, transceiver 120 can switch between different modes of operations, where in one operation mode transceiver 120 is connected to antenna 130 and disconnected from antenna 132 by switch system 110, and in another operation mode transceiver 120 is connected to antenna 132 and disconnected from antenna 130 by switch system 110.

The switch system 100 can include a controller 114 and switch assemblies 116 and 118. Controller 114 has outputs 114a and 114b. Switch assembly 116 has switch terminals 116a and 116b and a switch control terminal 116c. Also, switch assembly 118 has switch terminals 118a and 118b and a switch control terminal 118c. The output 114a of controller 114 can be coupled to the switch control terminal 116c of switch assembly 116, and the output 114b of controller 114 can be coupled to the switch control terminal 118c of switch assembly 118. By generating control signals at its outputs 114a and 114b, controller 114 can cause each respective switch assembly 116 and 118 to be in a first state or a second state. The first state can be an on state in which the switch is closed, and the second state can be an off state in which the switch is open. When switch 116 is closed, transceiver 120 can transmit signals to, or receive signals from, antenna 130, and when switch 118 is closed, transceiver 120 can transmit signals to, or receive signals from, antenna 132.

Also, controller 114 can cause switch assemblies 116 and 118 to be in opposite state at any given time. For example, when switch assembly 116 is in the on state and connects transceiver 120 to antenna 130, switch assembly 118 is in the off state to provide isolation between terminals 118a and 118b and disconnects transceiver 120 from antenna 132. Also, when switch assembly 118 is in the on state and connects transceiver 120 to antenna 132, switch assembly 116 is in the off state to provide isolation between terminals 116a and 116b and disconnects transceiver 120 from antenna 130.

In one example, controller 114 and switch assemblies 116 and 118 can be fabricated on the same semiconductor die (also called an integrated circuit (IC)). In another example, controller 114 may be fabricated on one IC, while switch assemblies 116 and 118 are fabricated on a separate IC.

Figure 2:
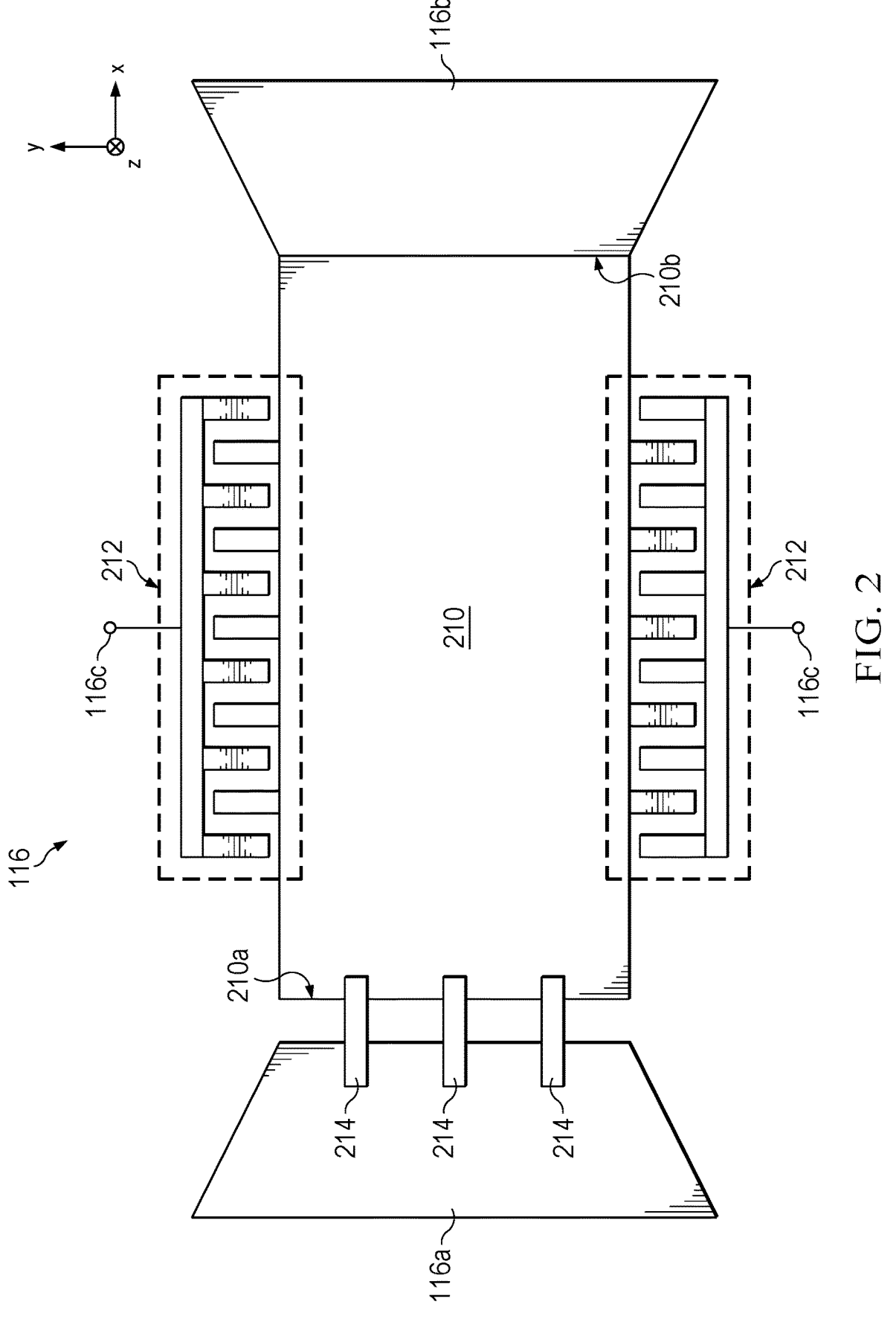
FIGS. 2 and 3 are schematic diagrams of a switch assembly that can be part of the system of FIG. 1 in accordance with various examples.
Figure 3:
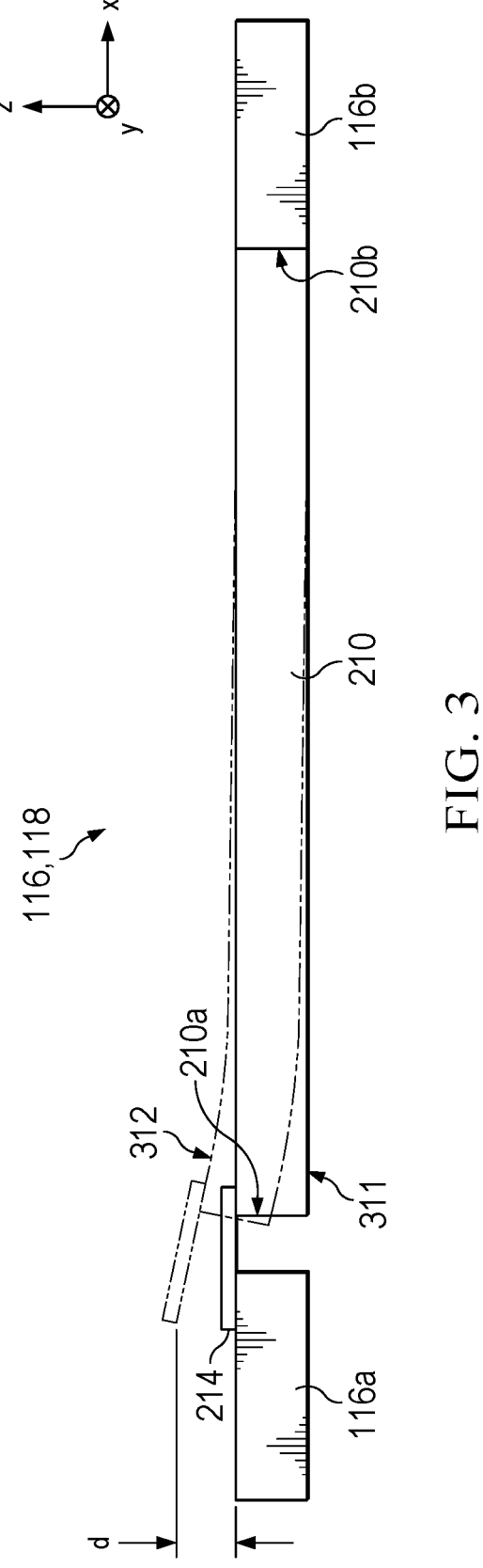

FIGS. 2 and 3 are schematic diagrams of switch assembly 116, in accordance with various examples. Switch assembly 118 can have the same or similar architecture. FIG. 2 is a top-down view (e.g., along the Z axis) of switch assembly 116, and FIG. 3 is a side view (e.g., along the Y axis) of switch assembly 116. Switch assembly 116 in this example is implemented as a microelectromechanical system (MEMS) structure including a bendable beam 210 between switch terminals 116a and 116b. The bendable beam 210 has opposing ends 210a and 210b. End 210b of bendable beam 210 can be cantilevered to switch terminal 116b. Actuators 212 can be provided on one or both sides of bendable beam 210. Switch control terminals 116c can be coupled to the actuators 212. Upon application of a suitable voltage on the switch control terminals 116c relative to the bendable beam 210, the end 210a of bendable beam 210 bends upward as shown in FIG. 3. The end 210a of bendable beam can have contacts 214 that make electrical contact with switch terminal 116a (switch closed) when a voltage on the switch control terminal 116 from controller 114 is such that the bendable beam is in state 311 (FIG. 3). Controller 114 can cause the end 210a of the beam 210 to bend upward to state 312 to thereby cause the switch 116 to be open.

The bendable beam 210 and switch terminals 116a and 116 can be formed from metal (e.g., aluminum). When a switch assembly 116 or 118 is an open state, the metal switch terminal 116a is spaced from but close to, end 210a and contacts 214 of bendable beam 210. A dielectric (e.g., air or other gas or a vacuum) may be between the switch terminal 116 and end 210a/contacts 214.

While switch assembly 116 is in the open state, various parasitic capacitances can provide a leakage path between terminals 116a and 116b, which degrades the isolation between terminals 116a and 116b provided by switch assembly 116. For example, a parasitic capacitance may be present between the switch terminal 116 and end 210a/contacts 214 when the switch assembly is open. Another parasitic capacitance can also be present between switch terminals 116a and 116b. The impedance of a capacitor is inversely proportional to frequency. Thus, at higher frequencies, the impedance of the parasitic capacitance is smaller than at lower frequencies. Accordingly, a low impedance leakage signal path can form between the switch terminals 116a and 116b through the parasitic capacitances described above.

The leakage signal that propagates through the switch assembly in the off state may contaminate other signals, or generate unwanted signals, which can compromise the function of the system that includes the switch assemblies. For example, referring again to FIG. 1, when switch assembly 116 is in the off state and switch assembly 118 is in the on state, antenna 130 is to be disconnected from transceiver 120, and antenna 132 is to be connected to transceiver 120. But because of the leakage path, the electrical signals transmitted by antenna 130 may contaminate the electrical signals transmitted by antenna 132, and transceiver 120 receives contaminated electrical signals. Also, the electrical signals transmitted by transceiver 120 meant for antenna 132 may also leak through switch assembly 116 and reach antenna 130, and antenna 130 can convert the leaked signal to wireless signals and transmit the wireless signals. Further, because the impedance of the leakage path (the parasitic capacitances) change with frequency, the magnitude of the leakage signal can also become, in part, a function of the signal frequency, which can further worsen the contamination of other signals by the leakage signal.

FIG. 4, FIG. 5, FIG. 6, and FIG. 7 are schematics of another example of switch assembly 116 that can provide improved off state isolation. The example switch assembly shown in FIGS. 4-7 can be used to implement switch assembly 118 as well. In the examples of FIGS. 4-7, switch assembly 116 includes a switch 402 and a leakage attenuation circuit 410 coupled between terminals 116a and 116b. Switch assembly 116 can include a switch 402 coupled to a leakage attenuation circuit 410. In some examples, switch 402 can be a single pole double throw switch. Switch 402 includes terminals 402a, 402b, and 402c. Terminal 402a is coupled to switch terminal 116a. Terminal 412b is coupled to switch terminal 116b. The leakage attenuation circuit 410 includes a first circuit terminal 411 and a second circuit terminal 412. The first circuit terminal 411 is couple to terminal 402c of switch 402. The second circuit terminal 412 is coupled to switch terminal 116b. Also, leakage attenuation circuit 410 is coupled between terminals 116b and 402c.

As to be described below, when switch assembly 116 is in an off state, switch 402 can disconnect terminals 402a from 402b to disconnect switch terminal 116a from switch terminal 116b. Switch 402 can also connect terminal 402a to terminal 402c. Leakage attenuation circuit 410 can receive a first signal at first circuit terminal 411 or second circuit terminal 412, and generate a second signal as an attenuated and phase shifted version of the first signal. The second signal can cancel (or at least attenuate) the leakage signal that propagates through the disabled path between terminals 402a and 402b by destructive interference. With such arrangements, switch assembly 116 can provide improved off state isolation between switch terminals 116a and 116b.

On the other hand, when switch assembly 116 is in an on state, switch 402 can connect terminals 402a to 402b to connect between switch terminals 116a and 116b to transmit an intended signal (e.g., a signal that carries data) Switch 402 can also disconnect terminal 402c from terminal 402a. Leakage attenuation circuit 410 can receive a first signal at first circuit terminal 411 or second circuit terminal 412, and generate a second signal as an attenuated and phase shifted version of the first signal. The second signal may attenuate the intended signal that propagates through the enabled path between terminals 402a and 402b, but because the second signal is attenuated and has a substantially lower magnitude than the intended signal, the degree of attenuation can be reduced, and the effect of leakage attenuation circuit 410 on the transmission of the intended signal by switch assembly 116 can be reduced or minimized.

Figure 4:
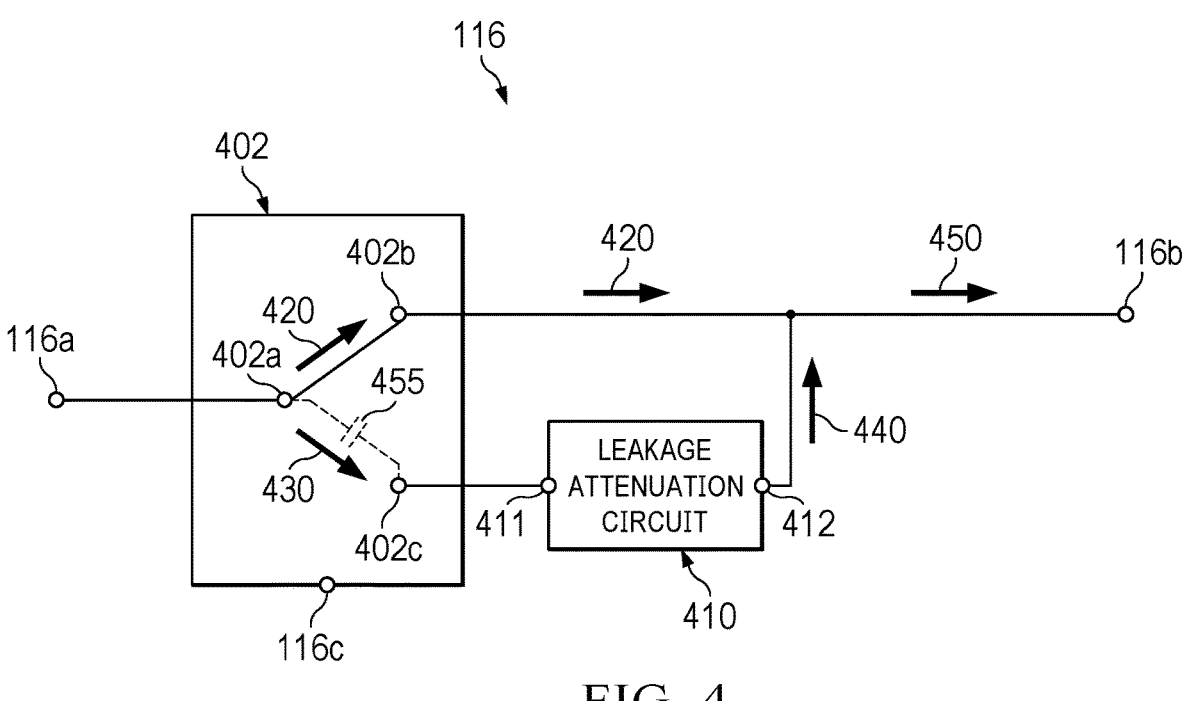
FIG. 4, FIG. 5, FIG. 6, and FIG. 7 are schematic diagrams illustrating a switch assembly including a leakage attenuation circuit and their operations in accordance with various examples.

FIGS. 4-7 illustrate various example operations of switch assembly 116. In FIG. 4, switch assembly 116 is in the on state in FIG. 4 in which terminals 402a and 402b are electrically coupled together so that a first signal (signal 420) at switch terminal 116a can propagate from terminal 402a to terminal 402b and switch terminal 116b. While in the on state, the circuit terminal 411 of the leakage attenuation circuit 410 is electrically disconnected from switch terminal 116a. With the switch assembly 116 in the on state, a parasitic capacitance 455 forms between terminals 402a and 402c, and a leakage signal 430 can propagate from switch terminal 116a and terminals 402a through parasitic capacitance 455 to terminal 402c and to the leakage attenuation circuit 410. As described above, the leakage attenuation circuit 410 can phase-invert and attenuate the leakage signal 430 to produce a phase-inverted second signal (signal 440). The phase-inverted signal 440 can combine with signal 420 (which propagates through the low-impedance enabled path from terminal 402a to terminal 402b) at switch terminal 116b to produce output signal 450. Because signals 420 and 440 have opposite phase, destructive interference can occur as a result of the combination. However, because the phase-inverted signal 440 is of a low enough amplitude relative to signal 420, the extent of the destructive interference can be reduced, so that output signal 450 can have similar magnitude as signal 420.

Figure 5:
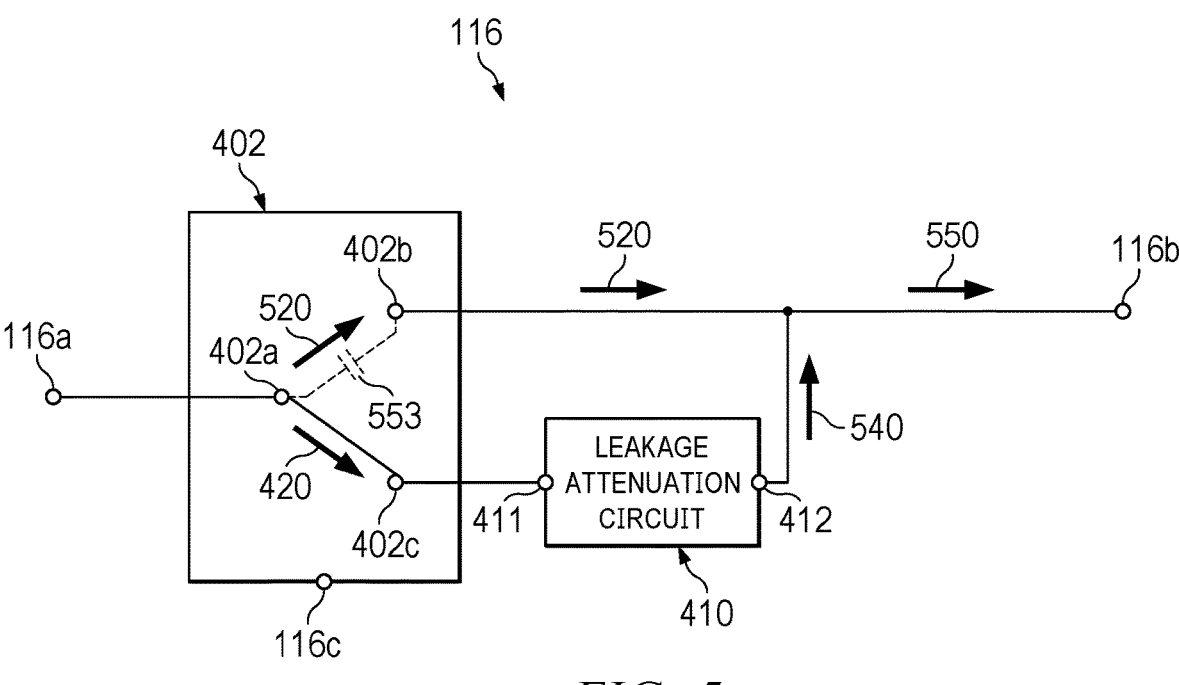

FIG. 5 illustrates the switch assembly 116 of FIG. 4 in the off state, in which terminals 402a and 402b are electrically disconnected from each other, and terminal 402a is electrically connected to circuit terminal 411 of the leakage attenuation circuit 410. While in the off state, a parasitic capacitance 553 may form between terminals 402a and 402b as described above, and a leakage signal 520 can propagate from switch terminal 116a and through terminals 402a and 402b to switch terminal 116b via parasitic capacitance 553. Also, signal 420 can propagate from switch terminal 116a, through terminals 402a and 402c, and to the leakage attenuation circuit 410. Signals 420 and 520 have the same phase and frequency, but signal 420 can have a larger amplitude than leakage signal 520 due to the much lower impedance path between terminals 402a and 402c than between terminals 402a and 402b when the switch assembly is in the off state. The leakage attenuation circuit 410 can receive signal 420 as the first signal, and invert the phase of signal 420 to produce phase-inverted signal 540 as the second signal, and provide phase-inverted signal 540 at switch terminal 116b. Phase-inverted signal 540 can combine with leakage signal 520 to produce signal 550 at switch terminal 116b. Because phase-inverted signal 540 has an opposite phase from leakage signal 520, destructive interference can occur as a result of the combination. Also, phase-inverted signal 540 can have similar magnitude as leakage signal 520, which can increase the extent of the destructive interference. Accordingly, signal 550 can become much attenuated compared with leakage signal 520, thereby improving the off state isolation between switch terminals 116a and 116b. Also, in generating signal 540, the leakage attenuation circuit 410 can attenuate the phase-inverted version of signal 420, or attenuate signal 420 before performing the phase inversion, so that the magnitudes of the leakage signal 520 and the phase-inverted signal 540 can match. Such arrangements can further increase the extent of destructive interference and reduce the magnitude of signal 550 at switch terminal 116b to improve the off state isolation.

Figure 6:
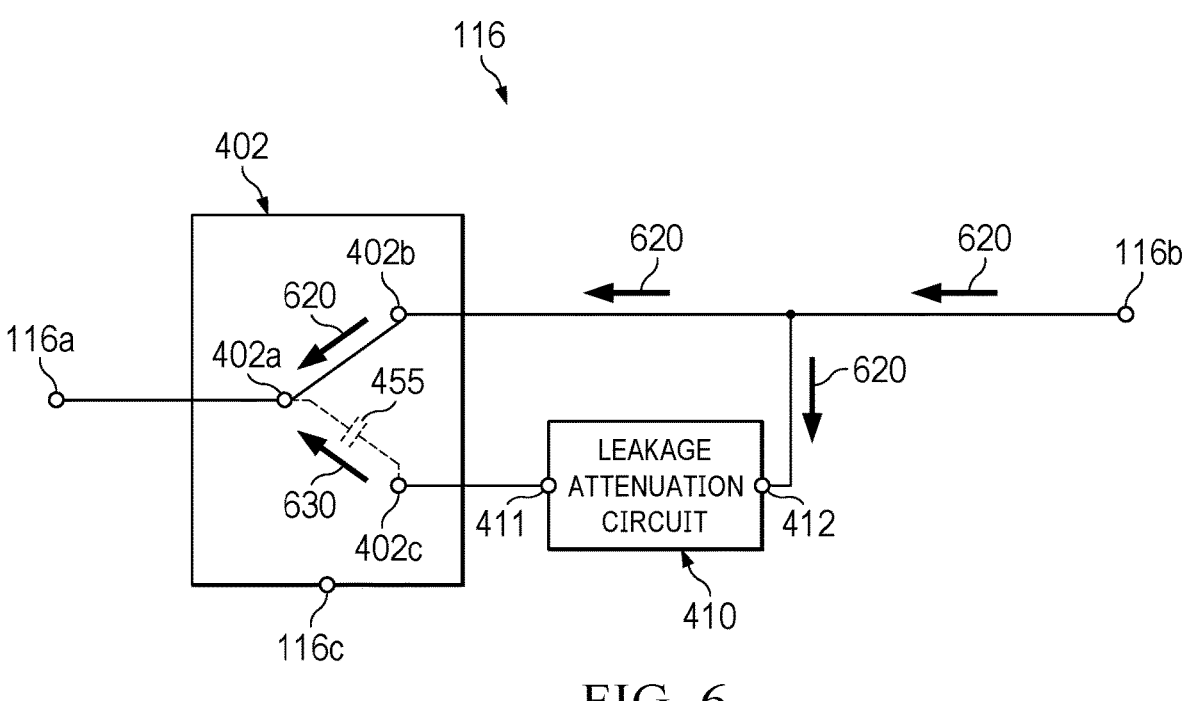
Figure 7:
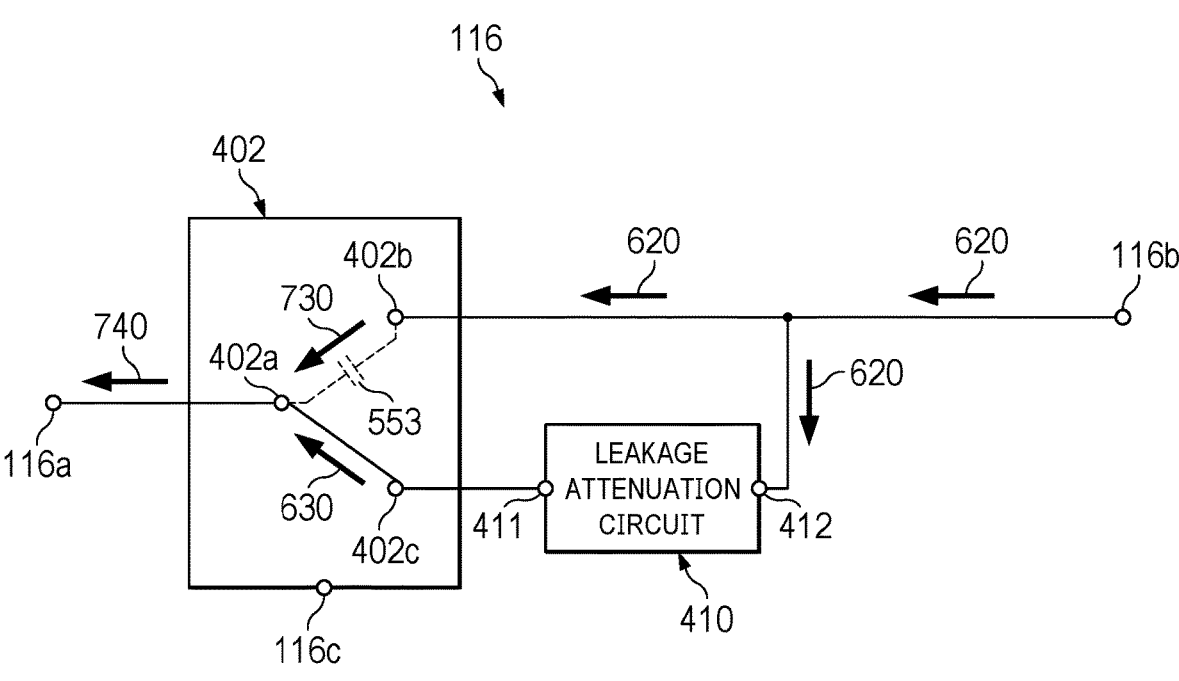

Switch assemblies 116 and 118 can be bidirectional. In FIGS. 4 and 5, a signal can propagate from left to right between switch terminal 116a and switch terminal 116b when the switch assembly is in the on state. FIGS. 6 and 7 show that switch assembly 116 (and switch assembly 118) can provide signal propagate from right to left as well. FIG. 6 shows the switch assembly in the on state with a signal 620 flowing from switch terminal 116b and between switch terminals 402b and 402a to switch terminal 116a. In the on state and as described above, switch 402 electrically disconnects circuit terminal 411 from terminal 402a but the parasitic capacitance 455 permits a signal path for signal 630 to flow from circuit terminal 411 of the leakage attenuation circuit 410 to terminal 402a and switch terminal 116a. The leakage attenuation circuit 410 phase-inverts and attenuates signal 620 (first signal) to signal 630 (second signal), which is further attenuated as it propagates through the high impedance disabled path from terminal 402c to terminal 402a. Because signal 630 has a significantly smaller magnitude than signal 620, signal 630 does not significantly attenuate signal 620 when combined with signal 620 even if they have opposite phases.

FIG. 7 shows switch assembly 116 in the off state with signal 620 flowing from switch terminal 116b to terminal 402b. In the off state and as described above, switch 402 electrically disconnects terminal 402b from terminal 402a but the parasitic capacitance 553 permits a signal path for a leakage signal 730 to flow between terminals 402b and 402a to switch terminal 116a. The leakage attenuation circuit 410 phase-inverts and attenuates signal 620 to produce a signal 630, which is a phase shifted and attenuated version of signal 620 and can have similar magnitude as leakage signal 730. At switch terminal 116a, signal 630 and leakage signal 730 can combine by destructive interference to provide signal 740, which is attenuated relative to leakage signal 730. Accordingly, the off state isolation of the switch assembly 116 between switch terminals 116b and 116a can be improved.

The example switch assembly described herein provides a compact structure to attenuate the switch's leakage and improve isolation. Such a compact structure can be especially advantageous in high frequency applications.

Figure 8:
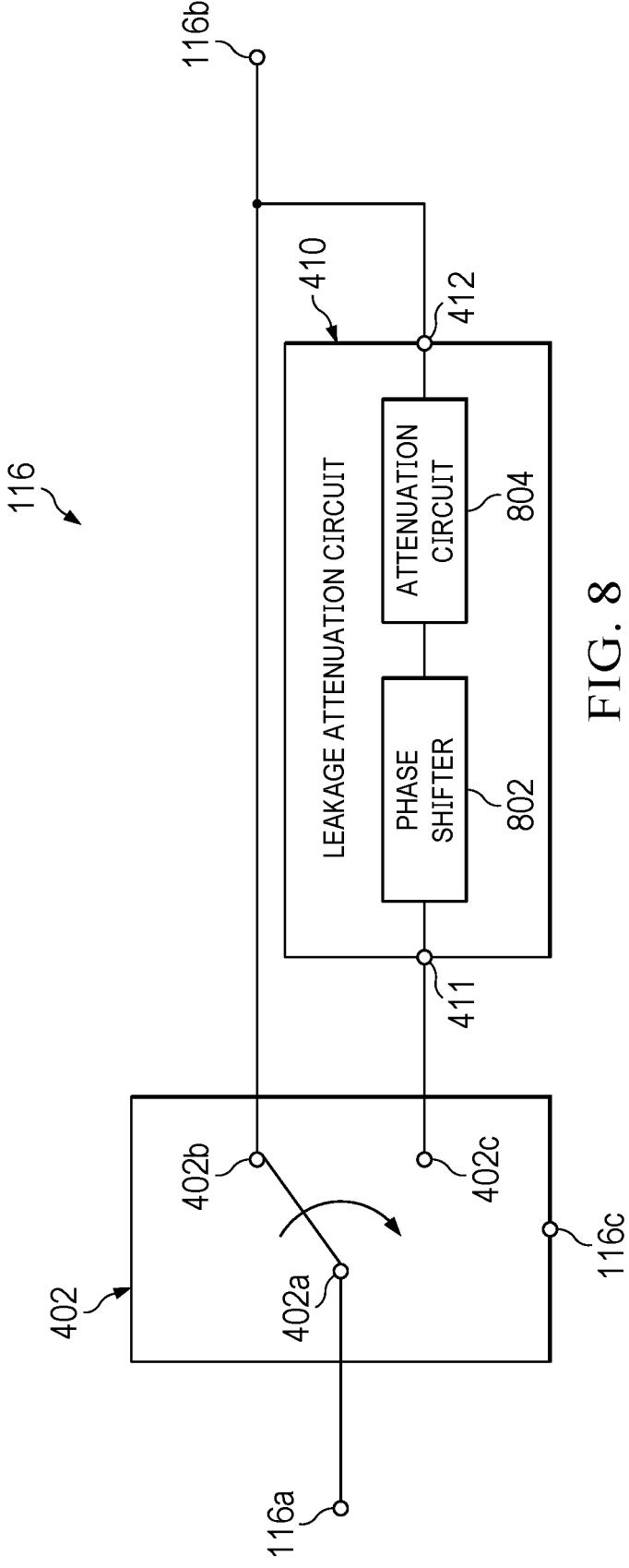
FIG. 8 is a schematic diagram illustrating internal components of the leakage attenuation circuit of FIGS. 4-7 in accordance with various examples.

FIG. 8 is a schematic diagram of switch assembly 116 illustrating example internal components of leakage attenuation circuit 410. In this example, leakage attenuation circuit 410 can include a phase shifter 802 coupled to an attenuation circuit 804. The phase shifter 802 is coupled between the attenuation circuit 804 and terminal 402c of switch 402. The attenuation circuit 804 is coupled between the phase shifter 802 and the switch terminal 116b. In another example, the order of the phase shifter 802 and attenuation circuit 804 can be reversed, with the attenuation circuit 804 coupled between terminal 402c and the phase shifter 802, and the phase shifter 802 coupled to switch terminal 116b. Phase shifter 802 and attenuation circuit 804 can combine to provide a 180 degree phase shift between first circuit terminal 411 and second circuit terminal 412. Moreover, phase shifter 802 and attenuation circuit 804 can combine to provide an attenuation between first circuit terminal 411 and second circuit terminal 412. In some examples, leakage attenuation circuit 410 may include one of phase shifter 802 or attenuation circuit 804 to provide both phase shifting and attenuation.

In some examples, attenuation circuit 804 can include a filter to perform the attenuation. In one example, the filter has a corner frequency based on an operation frequency of switch assembly 116, such as the frequency of the intended signal (e.g., signals 420 and 620) to be transmitted between switch terminals 116a and 116b when switch assembly 116 is in the on state. In some examples, the filter is a high pass filter having a corner frequency (3 dB frequency) at or above the operation frequency. The filter can attenuate the first signal (signals 420, 430, and 620) to generate the second signal, where the first signal has the same frequency as the intended signal. In an example where the filter is a high pass filter, the filter can also remove/attenuate low frequency leakage signals, or other unwanted signals. As described above, the attenuation of the first signal when the switch assembly is in the on state can reduce the destructive interference between the second signal and the intended signal, as illustrated in FIGS. 4 and 6. Also, the attenuation of the first signal when the switch assembly is in the off state can match the magnitudes of the second signal and the leakage signal, which can increase the destructive interference between the second signal and the leakage signal. In some examples, the filter has an adjustable corner frequency. In some examples, the filter can include a tunable/adjustable element, such as a tunable capacitor, a tunable inductor, a tunable resistor, etc., to provide an adjustable corner frequency.

Figure 9:
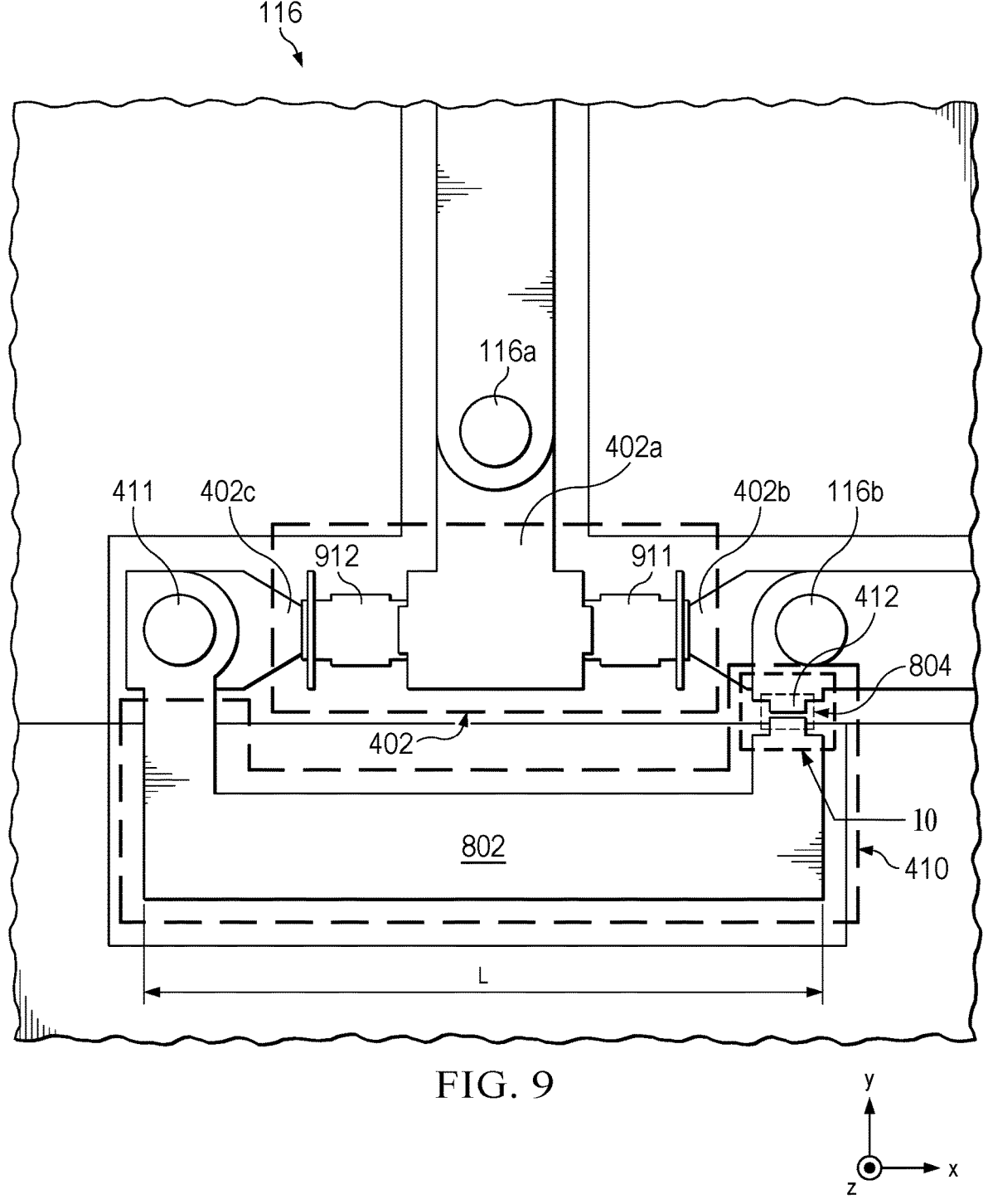
FIG. 9, FIG. 10, and FIG. 11 are schematic diagrams of a switch assembly that can be part of FIGS. 4-7 in accordance with various examples.

FIG. 9 is a schematic diagram of an example switch assembly 116, in which switch 402 includes a first microelectromechanical system (MEMS) switch 911 and a second MEMS switch 912. The first MEMS switch 911 is coupled between terminal 402a and terminal 402b. The second MEMS switch 912 is coupled between terminal 402a and terminal 402c. Each MEMS switch 911 and 912 can be implemented the same as or similar to the MEMS switch illustrated in FIGS. 2 and 3 and described above. MEMS switches 911 and 912 can be controlled so that when MEMS switch 911 is in the closed state electrically connecting terminal 402a to terminal 402b, MEMS switch 912 is opened thereby electrically disconnecting terminal 402a from terminal 402c. Conversely, when MEMS switch 911 is controlled to be in the open state electrically disconnecting terminal 402a from terminal 402b, MEMS switch is controlled to be in the closed state electrically connecting terminal 402a to terminal 402c.

Phase shifter 802 can be a metal strip (e.g., aluminum or other suitable metal) coupled between circuit terminal 411 of leakage attenuation circuit 410 and attenuation circuit 804. In one example, the phase inverter's metal strip is a quarter wavelength transmission line in which the length, L, of the transmission line is equal to one quarter of the wavelength of the signal traveling through the transmission line (e.g., one quarter of the wavelength corresponding to signals 430 (FIG. 4). 530 (FIG. 5), and 620 (FIGS. 6 and 7), to provide impedance inversion. The phase inverter can include other examples of impedance inverter. The metal strip can be part of the same metal layer as switch terminals 411 and 412 and switch terminals 116a and 116b.

Figure 10:
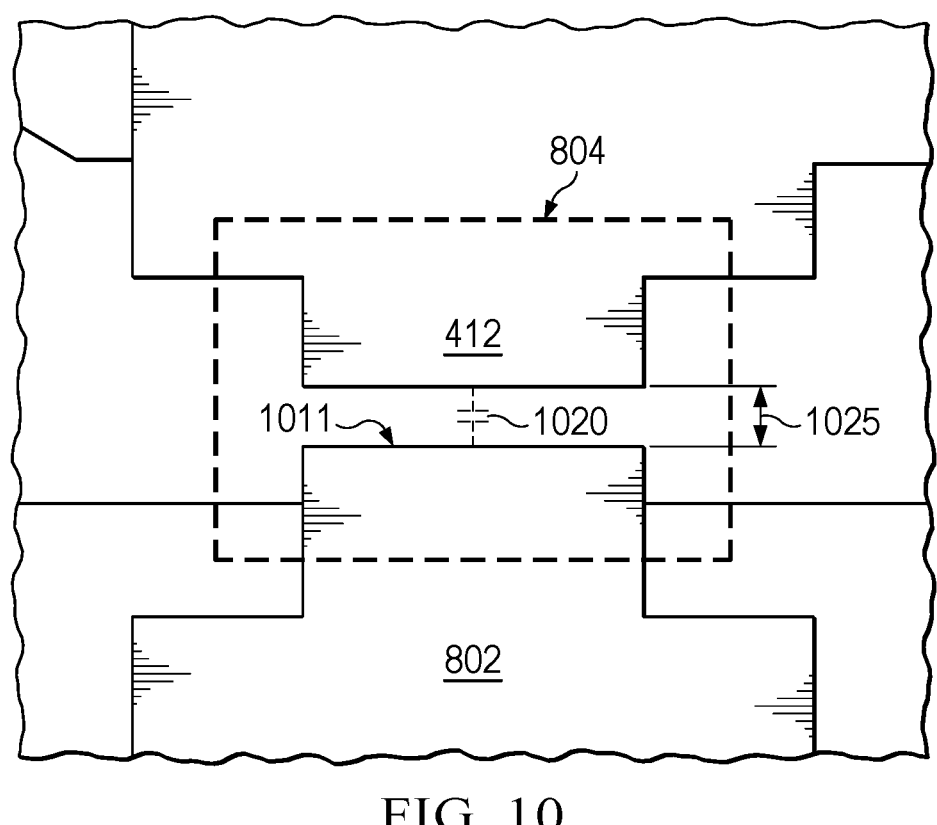

The attenuation circuit 804 in FIG. 9 includes a capacitor 1020 coupled between the end of phase shifter 802 and circuit terminal 412 as a high pass filter. FIG. 10 is a close-up view of the end 1011 of phase shifter 802 and circuit terminal 412. The capacitance of the capacitor 1020 is, in part, a function of the distance 1025 between the end of the phase inverter 902 and circuit terminal 412.

Figure 11:
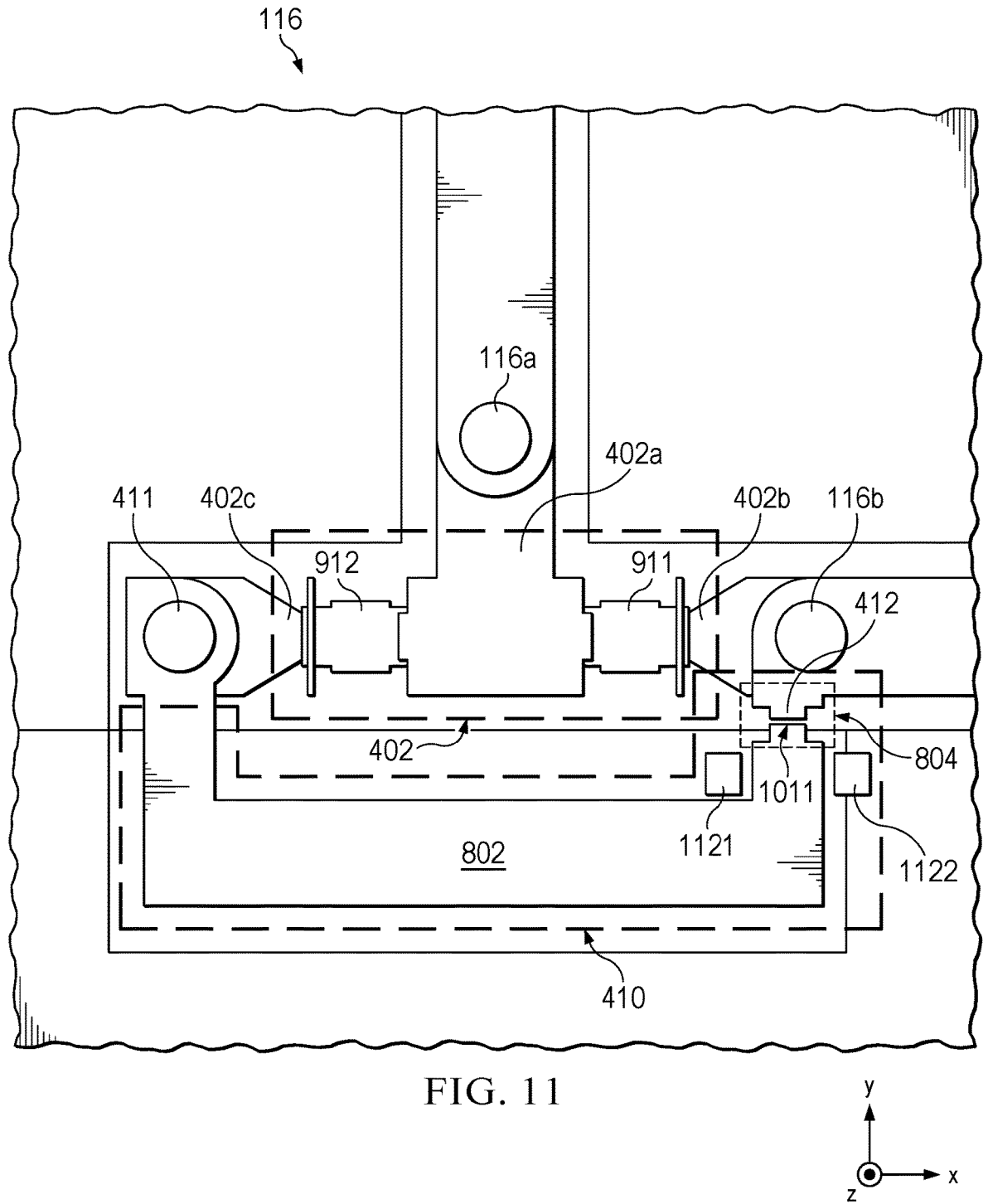

FIG. 11 is a schematic diagram of switch assembly 116 in which the attenuation circuit 804 includes an adjustable capacitance. The capacitance is formed between end 1011 of phase shifter 802 and switch terminal 412 as described above. Actuators 1121 and 1122 can be positioned on either side of the end 1011 of the phase shifter 802. The end 1011 of the phase inverter 802 can be cantilevered such that end 1011 can move up and down along the z-axis thereby changing the gap distance 1025 (FIG. 10) between end 1011 and switch terminal 412. As described above, the magnitude of the capacitance of the attenuation circuit 804 is, in part, a function of gap distance 1025. A voltage can be applied between actuators 1121, 1122 and the end 1011 of the phase inverter to create a fringing electric field. The fringing electric field creates a static force on the end 1011 of the phase inverter to move the end 1011 by an amount that is a function of the magnitude of the fringing electric field and thus the voltage applied to the actuators 1121, 1122. In one example, the actuators' voltage can be generated external to the switch system 110. In another example, the switch system 110 can be programmable and a value can be stored in, for example, register within the switch system 110. The switch system 110 can internally generate a voltage based on the programmed value to apply to the actuators 1121 and 1122. The programmable value can alternatively be specified by one or more passive components (e.g., resistor, capacitor) coupled to one or more externally-exposed terminals of the switch system 110.

Figure 12:
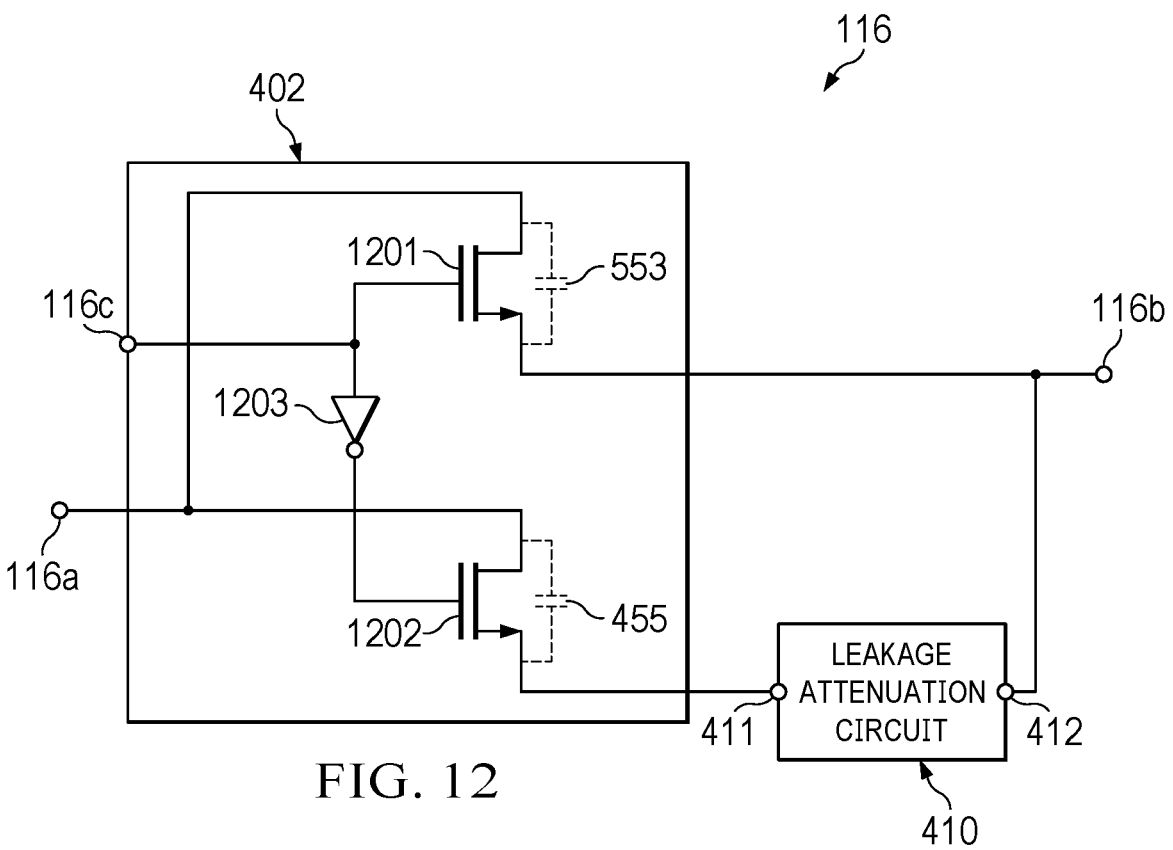
FIG. 12 is a schematic diagram of a switch assembly that can be part of FIGS. 4-7 in accordance with various examples.

FIG. 12 is a schematic diagram of switch assembly 116 in which switch 402 includes transistors 1201 and 1202 and inverter 1203. Transistors 1201 and 1202 can be n-channel field effect transistors (NFETs). The drains of transistors 1201 and 1202 are coupled to switch terminal 116a. Switch control terminal 116c is coupled to the gate of transistor 1201 and to the input of inverter 1203. The output of inverter 1203 is coupled to the gate of transistor 1202. The source of transistor 1201 is coupled to the switch terminal 116b. The source of transistor 1202 is coupled to circuit terminal 411 of the leakage attenuation circuit 410. The leakage attenuation circuit 410 can be implemented in accordance with any of the examples described above.

A control signal at a first logic level (e.g., logic high) provided at the switch control terminal 116c causes transistor 1201 to turn on and, through inverter 1203, transistor 1202 to turn off. Transistor 1201 being on and transistor 1202 being off represents the on state of switch assembly 116, as described above. Transistor 1201 being off and transistor 1202 being on represents the off state of switch assembly 116, as described above. The parasitic capacitance 553 described above is the drain-to-source capacitance of transistor 1201 when transistor 1201 is off, and the parasitic capacitance 455 is the drain-to-source capacitance of transistor 1202 when transistor 1202 is off.

Figure 13:
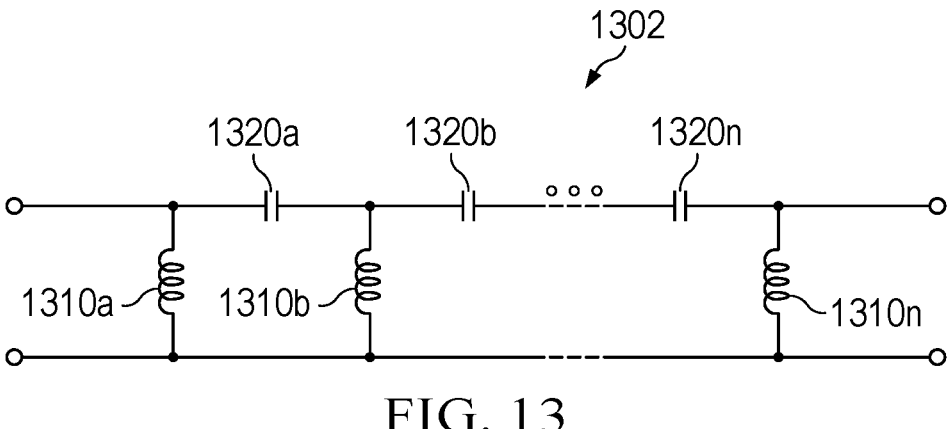
FIG. 13 is a schematic diagram illustrating internal components of the leakage attenuation circuit of FIGS. 4-13 in accordance with various examples.

FIG. 13 is an example of an inductor-capacitor (LC) ladder 1302, which can be used as the leakage attenuation circuit 410 described above. The LC ladder 1302 can include inductors 1310a, 1310a, . . . , 1310n and capacitors 1320a, 1320b, . . . , 1320n. The LC ladder 1302 can provide a phase shift similar to a transmission line, where the combined reactance of a pair of inductor and capacitor can introduce a phase shift in a signal as the signal propagates through the LC ladder. Moreover, the inductor and capacitor have non-zero resistance and can attenuate the signal by introducing loss. Further, the LC ladder can also provide high pass filtering.

Figure 14:
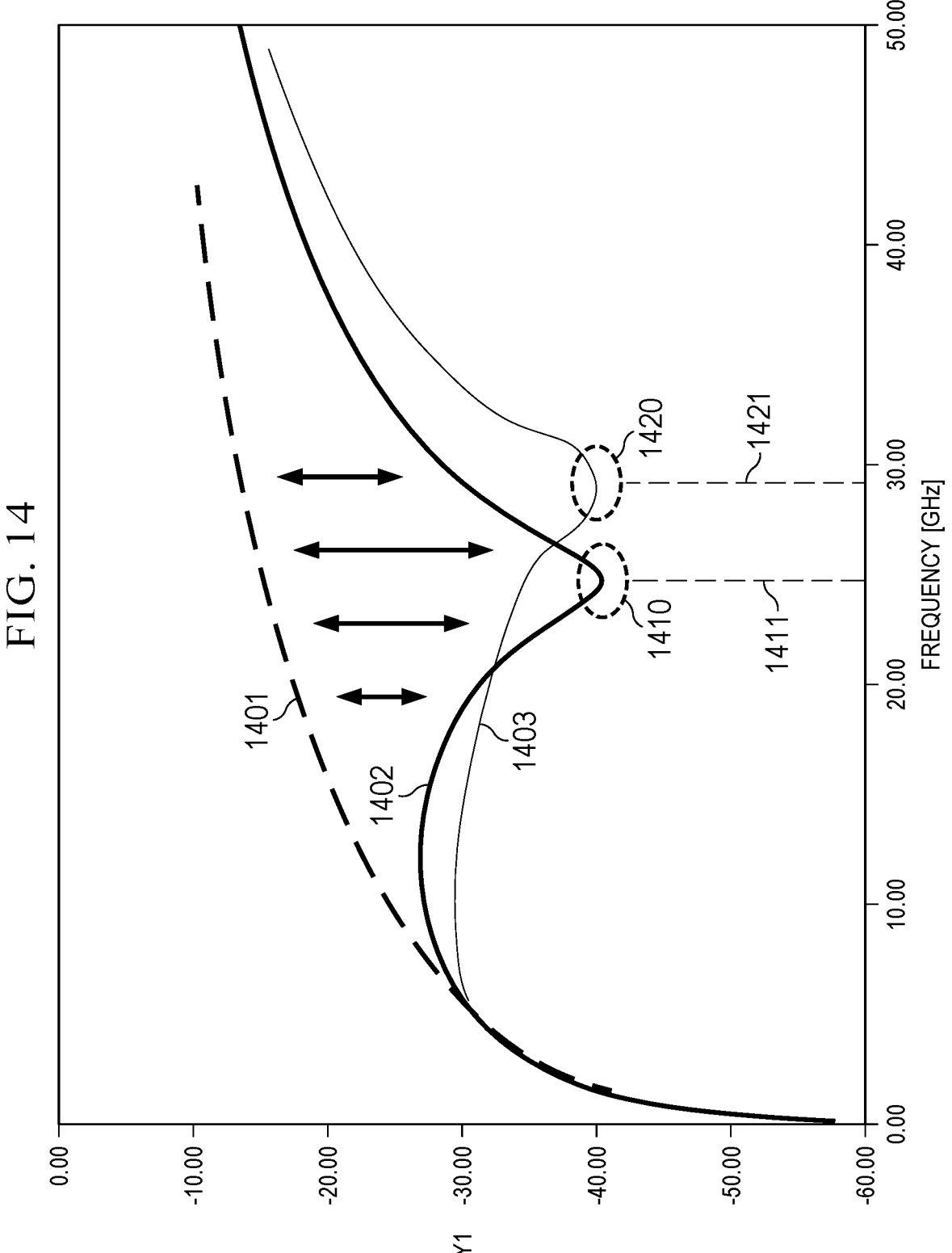
FIG. 14 are graphs illustrating example isolation properties of switch assemblies.

FIG. 14 are graphs 1401, 1402, and 1403 for the switch assembly in the off state showing the relationship between the power of a leakage signal through the switch 402 as a function of frequency. Graph 1401 is for a switch assembly that does not incorporate destructive interference (e.g., does not have the leakage attenuation circuit 410) to increase isolation of the switch assembly while in the off state. While in the off state, the impedance of the parasitic capacitance 553 decreases with increasing frequency, which increases the power of the leakage signal through switch 402 and degrades the off state isolation.

Graphs 1402 and 1403 are examples of a switch assembly that includes the leakage attenuation circuit 410 and employs destructive interference during the off state of the switch assembly to attenuate the leakage signal. Graph 1401 has a notch 1410 at frequency 1411 (25 GHZ) at which the power of the leakage signal is at a minimum and the isolation of the switch assembly during the off state is at a maximum. The frequency 1411 is a function of, at least in part, the capacitance of the attenuation circuit 804 described above. At that frequency, the signal provided by leakage attenuation circuit 410 has an opposite phase and a matching magnitude as the leakage signal, thus can attenuate the leakage signal. Graph 1420 is an example leakage signal attenuation graph for a switch assembly for which the capacitance of the attenuation circuit 804 is set to a different capacitance value than for the switch assembly of graph 1402. Accordingly, notch 1421 is at a different frequency than for notch 1410. FIG. 11, described above, provides an example of how the capacitance value can be adjusted.

FIG. 15 is a flow chart of an example method 1500 for increasing the leakage signal isolation of a switch assembly. Method 1500 can be performed by, for example, controller 114 in conjunction with examples of switch assembly 116 and/or switch assembly 118 described herein.

At operation 1502, switch assembly 116/118 receives a first signal at a switch input. The switch input can be switch terminal 116a or 116b (or 118a or 118b).

At operation 1504, switch assembly 116/118 generates a second signal as a phase-shifted and attenuated version of the first signal. The leakage attenuation circuit 410 can perform this phase-shift and attenuation, as described above.

At operation 1506, switch assembly 116/118 receives a control signal indicative of whether the switch assembly is to operate in a first state or in a second state. The first state can be the on state, and the second state can be the off state. The received control signal can be a switch control received at the respective switch control terminal 116c, 118c.

At operation 1508, if switch assembly 116/118 is to operate in the first state (e.g., on state, a closed state, etc.), switch assembly 116/118 can proceed to operation 1510, in which switch assembly 116/118 connects the switch input (one of the switch terminals) to a switch output (the other of the switch terminals). At operation 1510, switch assembly 116/118 transmits the first signal from the switch input to the switch output.

Referring back to operation 1508, if switch assembly 116/118 is to operate in the second state (off state, an open state, etc.), switch assembly 116/118 can proceed to operation 1514, in which switch assembly 116/118 disconnects the switch input from the switch output. At operation 1516, switch assembly 116/118 transmits the second signal (generated at operation 1504 by leakage attenuation circuit 410) to the switch output.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead with little or no change to the remaining circuitry. For example, a field effect transistor ("FET") (such as an n-channel FET (NFET) or a p-channel FET (PFET)), a bipolar junction transistor (BJT—e.g., NPN transistor or PNP transistor), an insulated gate bipolar transistor (IGBT), and/or a junction field effect transistor (JFET) may be used in place of or in conjunction with the devices described herein. The transistors may be depletion mode devices, drain-extended devices, enhancement mode devices, natural transistors or other types of device structure transistors. Furthermore, the devices may be implemented in/over a silicon substrate (Si), a silicon carbide substrate (SiC), a gallium nitride substrate (GaN) or a gallium arsenide substrate (GaAs).

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

In this description, unless otherwise stated, "about," "approximately" or "substantially" preceding a parameter means being within +/−10 percent of that parameter or, if the parameter is zero, a reasonable range of values around zero.

Modifications are possible in the described embodiments, and other embodiments are possible, within the scope of the claims.

What is claimed is:

1. An apparatus comprising:
a switch assembly having first and second switch terminals and a control terminal, the switch assembly including a circuit, and the switch assembly configurable to:
responsive to the control terminal having a first state: connect the first switch terminal to the second switch terminal, and disconnect a terminal of the circuit from the first switch terminal, to enable a transmission of a signal between the first and second switch terminals; and
responsive to the control terminal having a second state: connect the terminal of the circuit to the first switch terminal, and disconnect the first switch terminal from the second switch terminal, to disable the transmission of the signal between the first and second switch terminals.

2. The apparatus of claim 1, wherein the circuit terminal is a first circuit terminal, the leakage attenuation circuit has a second circuit terminal coupled to the second switch terminal, and the leakage attenuation circuit is configured to:
provide a second signal based on the first signal at the second or first circuit switch terminal to combine with a leakage signal that propagates between the first and second switch terminals when the control terminal has the second state to attenuate the leakage signal.

3. The apparatus of claim 2, wherein the circuit includes at least one of an impedance inverter circuit or a phase shifter circuit.

4. The apparatus of claim 2, wherein the circuit is configurable to generate the first signal having a 180 degree phase shift relative to the second signal.

5. The apparatus of claim 2, wherein the circuit is configurable to generate the second signal by attenuating the first signal.

6. The apparatus of claim 2, wherein the circuit includes a capacitor coupled between the first and second circuit switch terminals.

7. The apparatus of claim 6, wherein the capacitor has a configurable capacitance.

8. The apparatus of claim 7, wherein a frequency of the leakage signal to be attenuated by the circuit is configurable based on the configurable capacitance of the capacitor.

9. The apparatus of claim 6, wherein the capacitor includes a microelectromechanical system (MEMS) capacitor.

10. The apparatus of claim 1, wherein the circuit includes a metal strip.

11. The apparatus of claim 1, wherein the circuit includes an inductor and a capacitor.

12. The apparatus of claim 1, wherein the switch assembly includes a single pole double throw switch.

13. The apparatus of claim 1, wherein the switch assembly includes:

a first switch coupled between the first switch terminal and the second switch terminal, the first switch having a first switch control terminal coupled to the control terminal; and a second switch coupled between the first switch terminal and the terminal of the circuit, the second switch having a second switch control terminal coupled to the control terminal.

14. The apparatus of claim 13, wherein the first switch includes a first microelectromechanical system (MEMS) switch, and the second switch includes a second MEMS switch.

15. The apparatus of claim 13, wherein each of the first and second switches includes a respective transistor.

16. A system comprising:

a controller having first and second control outputs, the controller configurable to:

in a first mode, set the first control output to a first state and the second control output to a second state; and in a second mode, set the first control output to the second state and the second control output to the first state;

a first switch assembly coupled between a first radio frequency (RF) terminal and a second RF terminal, the first switch assembly having a first switch control terminal coupled to the first control output and including a first circuit, the first switch assembly configurable to:

responsive to the first switch control terminal having the first state, connect the first RF terminal to the second RF terminal and disconnect a first circuit terminal of the first circuit from one of the first RF terminal or the second RF terminal; and responsive to the first switch control terminal having the second state, connect the first circuit terminal to the one of the first RF terminal or the second RF terminal and disconnect the first RF terminal from the second RF terminal; and a second switch assembly coupled between a third RF terminal and the second RF terminal, the second switch assembly having a second switch control terminal coupled to the second control output and including a second circuit, the second switch assembly configurable to:

responsive to the second switch control terminal having the second state, connect the third RF terminal to the second RF terminal and disconnect a second circuit terminal of the second circuit from one of the third RF terminal or the second RF terminal; and responsive to the second switch control terminal having the first state, connect the second circuit terminal to the one of the third RF terminal or the second RF terminal and disconnect the third RF terminal from the second RF terminal.

17. The system of claim 16, wherein:

the first circuit has a third circuit terminal and is configurable to:

receive a first signal at the first or third circuit terminal; and provide the first signal responsive to a second signal at the third or first circuit terminal to combine with a first leakage signal that propagates between the first RF terminal and the second RF terminal when the first switch control terminal has the second state; and the second circuit has a fourth circuit terminal and is configurable to:

provide a third signal responsive to a fourth signal at the fourth or second circuit terminal to combine with a second leakage signal that propagates between the third RF terminal and the second RF terminal when the second switch control terminal has the first state.

18. The system of claim 16, wherein at least one of the first or second circuit includes at least one of an impedance inverter circuit or a phase shifter circuit.

19. The system of claim 16, wherein at least one of the first or second circuit includes at least one of: a metal strip, an inductor, or a capacitor.

20. The system of claim 16, wherein the first switch assembly includes a first MEMS switch or a first transistor coupled between the first RF terminal and the second RF terminal, and a second MEMS switch or a second transistor coupled between the first circuit terminal and the one of the first RF terminal or the second RF terminal; and wherein the second switch assembly includes a third MEMS switch or a third transistor coupled between the third RF terminal and the second RF terminal, and a fourth MEMS switch or a fourth transistor coupled between the second circuit terminal and the one of the third RF terminal or the second RF terminal.

21. The system of claim 16, further comprising a first antenna, a second antenna, and an RF choke, wherein the first antenna is coupled to the second RF terminal, the second antenna is coupled to the third RF terminal, and the RF choke is coupled to the first RF terminal.

22. The system of claim 16, wherein the first switch assembly, the second switch assembly, the first circuit, the second circuit, and the controller are part of an integrated circuit.

23. A method comprising:

generating a first signal as a phase-shifted and attenuated version of a second signal at a first switch terminal of a switch assembly;

responsive to the switch assembly being in an on state:

transmitting the second signal to a second switch terminal; and responsive to the switch assembly being in an off state:

transmitting the first signal to the second switch terminal to disable the transmission of the second signal between the first and second switch terminals.

24. The method of claim 23, wherein generating the first signal as the phase-shifted and attenuated version of the second signal includes phase shifting the second signal by 180 degrees.

25. The method of claim 23, wherein:

connecting the first switch terminal to the second switch terminal includes enabling a first MEMS switch or a first transistor, and transmitting the second signal to the second switch terminal includes transmitting the second signal to the second switch terminal through the enabled first MEMS switch or the enabled first transistor; and disconnecting the first switch terminal from the second switch terminal includes disabling the first MEMS switch or the first transistor, and transmitting the first signal to the second switch terminal includes transmitting the first signal to the second switch terminal through a second MEMS switch or a second transistor.

26. An apparatus comprising:

a switch assembly having first and second switch terminals and a control terminal, the switch assembly including a circuit having a property based on a leakage characteristic between the first and second switch terminals, and the switch assembly configurable to:

responsive to the control terminal having a first state to enable the switch assembly:

connect the first switch terminal to the second switch terminal, and disconnect a terminal of the circuit from the first switch terminal; and responsive to the control terminal having a second state to disable the switch assembly:

connect the terminal of the circuit to the first switch terminal, and disconnect the first switch terminal from the second switch terminal.

27. The apparatus of claim 26, wherein the circuit is configurable to attenuate a leakage signal at the first or second switch terminal when the control terminal is in the second state.

* * * * *